(12) United States Patent
Rangarajan et al.

(10) Patent No.: US 9,817,054 B2
(45) Date of Patent: Nov. 14, 2017

(54) ELECTRICAL MARGINING OF MULTI-PARAMETER HIGH-SPEED INTERCONNECT LINKS WITH MULTI-SAMPLE PROBING

(71) Applicant: Intel Corporation, Santa Clara, CA (US)

(72) Inventors: Thanunathan Rangarajan, Bangalore (IN); Shreesh Chhabbi, Bangalore (IN); Arvind A. Kumar, Beaverton, OR (US); Venkatraman Iyer, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 1133 days.

(21) Appl. No.: 13/729,756

(22) Filed: Dec. 28, 2012

(65) Prior Publication Data

US 2014/0002102 A1 Jan. 2, 2014

(30) Foreign Application Priority Data

Jun. 28, 2012 (IN) .......................... 2613/CHE/2012

(51) Int. Cl.
  *G01R 31/04* (2006.01)
  *G01R 31/30* (2006.01)
(52) U.S. Cl.
  CPC .............. *G01R 31/04* (2013.01); *G01R 31/30* (2013.01)
(58) Field of Classification Search
  CPC ................................ G01R 31/04; G01R 31/30
  USPC ......................................................... 324/538
  See application file for complete search history.

(56) References Cited

U.S. PATENT DOCUMENTS

2005/0114125 A1* 5/2005 Chang .................. H04L 25/062
                                                          704/230
2008/0219359 A1* 9/2008 Salomon .............. H03K 17/164
                                                          375/257

OTHER PUBLICATIONS

Chowdhury et al., Intel® Core™ i5/i7 QuickPath Interconnect receiver clocking circuits and training algorithm, in International Symposium on VLSI Design, Automation, and Test (VLSI-DAT), 2012, vol., No., pp. 1-4, Apr. 23-25, 2012.*

(Continued)

*Primary Examiner* — Daniel Miller
(74) *Attorney, Agent, or Firm* — Alpine Technology Law Group LLC

(57) ABSTRACT

Methods and apparatus relating to electrical margining of multi-parameter high-speed interconnect links with multi-sample probing are described. In one embodiment, logic is provided to generate one or more parameter values, corresponding to an electrical operating margin of an interconnect. The one or more parameter values are generated based on a plurality of eye observation sets to be detected in response to operation of the interconnect in accordance with a plurality of parameter sets (e.g., by using quantitative optimization techniques). In turn, the interconnect is to be operated at the one or more parameter values if it is determined that the one or more parameter values cause the interconnect to operate at an optimum level relative to an operation of the interconnect in accordance with one or more less optimum parameter levels. Other embodiments are also disclosed and claimed.

21 Claims, 11 Drawing Sheets

(56) References Cited

OTHER PUBLICATIONS

Genetic algorithm, available at https://web.archive.org/web/20110213090522/http://en.wikipedia.org/wiki/Genetic_algorithm on Feb. 13, 2011.*

* cited by examiner

US 9,817,054 B2

ELECTRICAL MARGINING OF MULTI-PARAMETER HIGH-SPEED INTERCONNECT LINKS WITH MULTI-SAMPLE PROBING

RELATED APPLICATIONS

The present application claims priority to Indian patent application no. 613/CHE/2012, filed on Jun. 28, 2012, entitled "Electrical Margining of Multi-parameter High-speed Interconnect Links with Multi-sample Probing", which is incorporated herein by reference for all purposes.

FIELD

The present disclosure generally relates to the field of electronics. More particularly, some embodiments relate to electrical margining of multi-parameter high-speed interconnect links with multi-sample probing.

BACKGROUND

Computer systems are made up of components that may communicate with one another for various purposes. Links that interconnect computer components may provide a mechanism for transferring data signals between the components.

These links may provide reliable communication only if the signals they carry are free from interference and signal degradation. However, as the speed of such links are increased, marginal electrical behavior may also occur resulting in communication errors. Accordingly, signal transmission that is free from interference and signal degradation can be paramount to reliable operation of such links.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
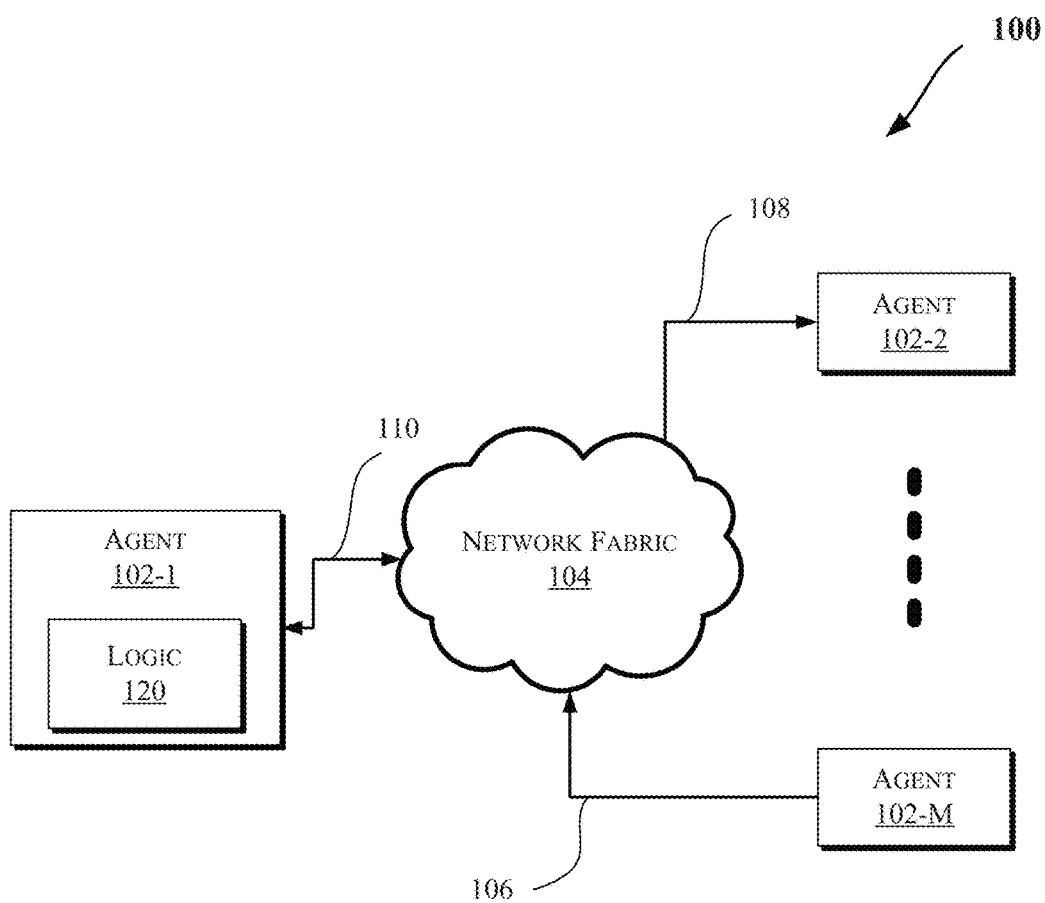
FIGS. 1-2 and 12-13 illustrate block diagrams of embodiments of computing systems, which may be utilized to implement various embodiments discussed herein.

In the following description, numerous specific details are set forth in order to provide a thorough understanding of various embodiments. However, some embodiments may be practiced without the specific details. In other instances, well-known methods, procedures, components, and circuits have not been described in detail so as not to obscure the particular embodiments. Various aspects of embodiments of the invention may be performed using various means, such as integrated semiconductor circuits ("hardware"), computer-readable instructions organized into one or more programs ("software") or some combination of hardware and software. For the purposes of this disclosure reference to "logic" shall mean either hardware, software, or some combination thereof.

Some embodiments provide for electrical margining of multi-parameter high-speed interconnect links with multi-sample probing. In an embodiment, an interconnect link is configured for better overall signal quality, signal reliability, fault tolerance, and/or longevity over relatively longer trace distances (e.g., in today's low-cost PCBs (Printed Circuit Boards)) at higher speeds. In an embodiment, signal margining of high-speed interconnects involves programming a trial set of electrical parameters into the Interconnect RX/TX (Receive/Transmit) hardware, and then performing analysis of the resultant sample space of eye shapes at different sampling points (that collectively constitute the eye schmoo). The set of eyes obtained may match or meet certain requirements such as a width value, a height value, alignment to the eye center, etc.

As discussed herein, an eye pattern or shape (also known as an eye diagram) refers to an oscilloscope display in which a digital data signal from a receiver is repetitively sampled and applied to the vertical input, while the data rate may be used to trigger a horizontal sweep. It is referred to as an eye in part because, for several types of coding, the pattern looks like a series of eyes between a pair of rails. Generally, the size and shape of the eye may be considered as measures of quality of the eye.

In various embodiments, the electrical settings of an interconnect may be represented as chromosomes which are then processed by application of Genetic Algorithm (GA), e.g., in combination with an associated quantitative optimization technique in order to search for and select the optimum electrical margining for a given High-Speed Differential (HSD) link interconnect. Such techniques may offer the twin benefit of convergence to the right solution with minimal resource consumption (memory, processing, etc.). Generally, genetic algorithms belong to the larger class of evolutionary algorithms (EA), which generate solutions to optimization problems using techniques inspired by natural evolution, such as inheritance, mutation, selection, and/or crossover. In a genetic algorithm, a population of strings (called chromosomes), which encode candidate solutions to an optimization problem, evolves toward better solutions. At least one embodiment utilizes a Genetic Algorithm based approach, e.g., using quantitative optimization techniques, to solve the problem of selecting optimum electrical margining parameters for a high-speed interconnect. Also, in some embodiments, a firmware or hardware resident Optimizer Engine (OE) that uses the above techniques determines optimum eye and hence optimum electrical margining for a high-speed interconnect.

Various embodiments are discussed herein with reference to a computing system component, such as the components discussed herein, e.g., with reference to FIGS. 1-2 and 12-13. More particularly, FIG. 1 illustrates a block diagram of a computing system 100, according to an embodiment of the invention. The system 100 may include one or more agents 102-1 through 102-M (collectively referred to herein as "agents 102" or more generally "agent 102"). In an embodiment, the agents 102 may be components of a computing system, such as the computing systems discussed with reference to FIGS. 2 and 12-13.

As illustrated in FIG. 1, the agents 102 may communicate via a network fabric 104. In an embodiment, the network fabric 104 may include one or more interconnects (or interconnection networks) that communicate via a serial (e.g., point-to-point) link and/or a shared communication network. For example, some embodiments may facilitate component debug or validation on links that allow communication with fully buffered dual in-line memory modules (FBD), e.g., where the FBD link is a serial link for coupling memory modules to a host controller device (such as a processor or memory hub). Debug information may be transmitted from the FBD channel host such that the debug information may be observed along the channel by channel traffic trace capture tools (such as one or more logic analyzers).

In one embodiment, the system 100 may support a layered protocol scheme, which may include a physical layer, a link layer, a routing layer, a transport layer, and/or a protocol layer. The fabric 104 may further facilitate transmission of data (e.g., in form of packets) from one protocol (e.g., caching processor or caching aware memory controller) to another protocol for a point-to-point network. Also, in some embodiments, the network fabric 104 may provide communication that adheres to one or more cache coherent protocols.

Furthermore, as shown by the direction of arrows in FIG. 1, the agents 102 may transmit and/or receive data via the network fabric 104. Hence, some agents may utilize a unidirectional link while others may utilize a bidirectional link for communication. For instance, one or more agents (such as agent 102-M) may transmit data (e.g., via a unidirectional link 106), other agent(s) (such as agent 102-2) may receive data (e.g., via a unidirectional link 108), while some agent(s) (such as agent 102-1) may both transmit and receive data (e.g., via a bidirectional link 110).

Also, in accordance with an embodiment, one or more of the agents 102 may include logic 120 to provide electrical margining of multi-parameter high-speed interconnect links with multi-sample probing as discussed herein. In some embodiments, one or more components of a multi-agent system (such as processor core, chipset, input/output hub, memory controller, etc.) may include a logic 120 as will be further discussed with reference to the remaining figures.

Figure 2:
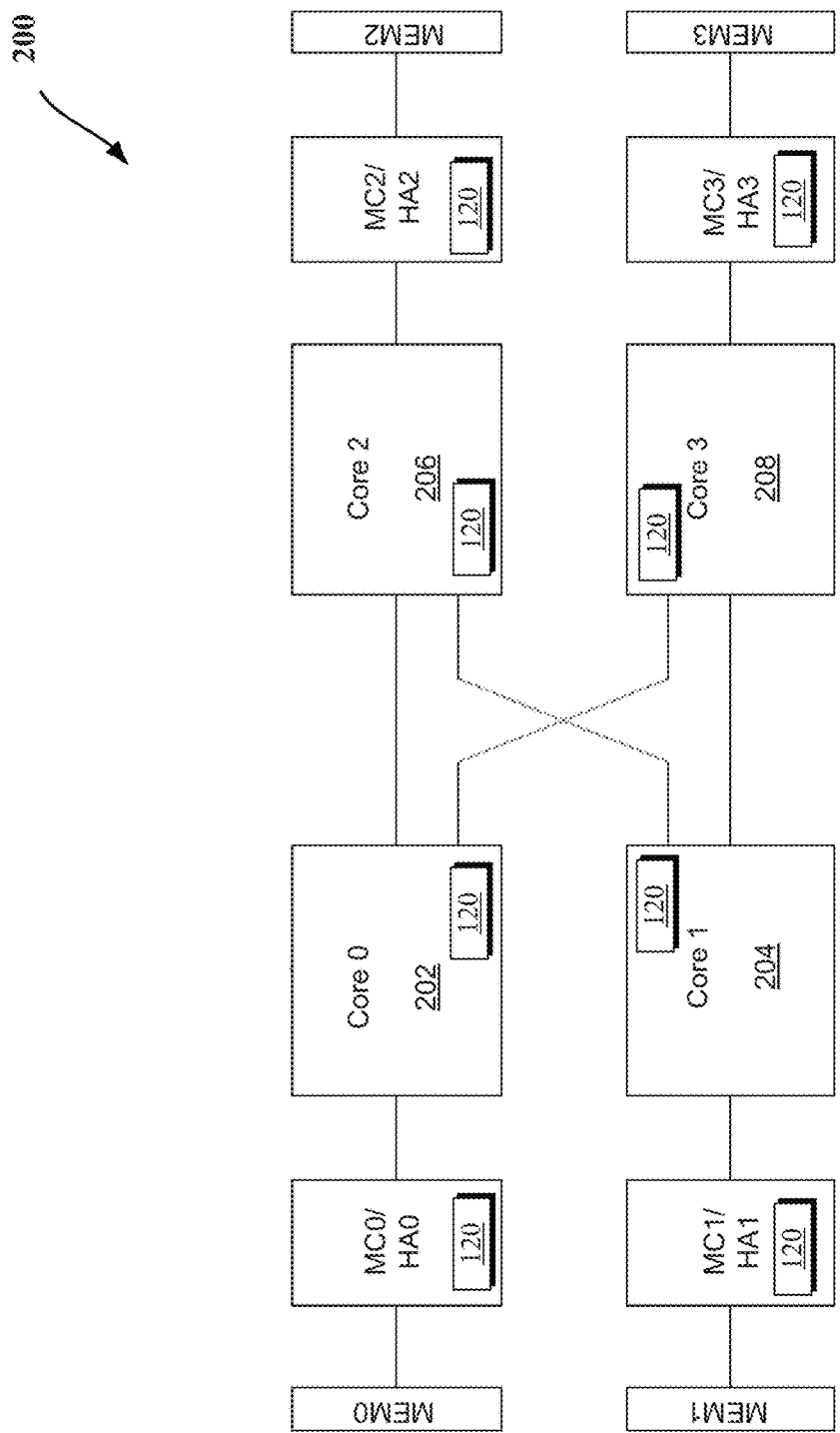

More specifically, FIG. 2 is a block diagram of a computing system 200 in accordance with an embodiment. System 200 may include a plurality of sockets 202-208 (four shown but some embodiments may have more or less socket). Each socket may include a processor and a logic 120. In some embodiments, logic 120 may be present in one or more components of system 200 (such as those shown in FIG. 2). However, more or less logic 120 blocks may be present in a system depending on the implementation. For example, each end of a HSD link interconnect may include logic 120 (or portions thereof) to provide electrical margining of multi-parameter high-speed interconnect links with multi-sample probing as discussed herein. Also, each socket may be coupled to the other sockets via a point-to-point (PtP) link, such as a Quick Path Interconnect (QPI). As discussed with respect the network fabric 104 of FIG. 1, each socket may be coupled to a local portion of system memory, e.g., formed of a plurality of Dual Inline Memory Modules (DIMMs) that may include dynamic random access memory (DRAM).

As shown in FIG. 2, each socket may be coupled to a memory controller (MC)/Home Agent (HA) (such as MC0/HA0 through MC3/HA3). The memory controllers may be coupled to a corresponding local memory (labeled as MEM0 through MEM3), which may be a portion of system memory (such as memory 1212 of FIG. 12). In some embodiments, the memory controller (MC)/Home Agent (HA) (such as MC0/HA0 through MC3/HA3) may be the same or similar to agent 102-1 of FIG. 1 and the memory, labeled as MEM0 through MEM3, may be the same or similar to memory discussed with reference to any of the figures herein. Generally, processing/caching agents may send requests to a home node for access to a memory address with which a corresponding "home agent" is associated. Also, in one embodiment, MEM0 through MEM3 may be configured to mirror data, e.g., as master and slave. Also, one or more components of system 200 may be included on the same integrated circuit die in some embodiments.

Furthermore, one implementation (such as shown in FIG. 2) may be for a socket glueless configuration with mirroring. For example, data assigned to a memory controller (such as MC0/HA0) may be mirrored to another memory controller (such as MC3/HA3) over the PtP links.

Figure 3:
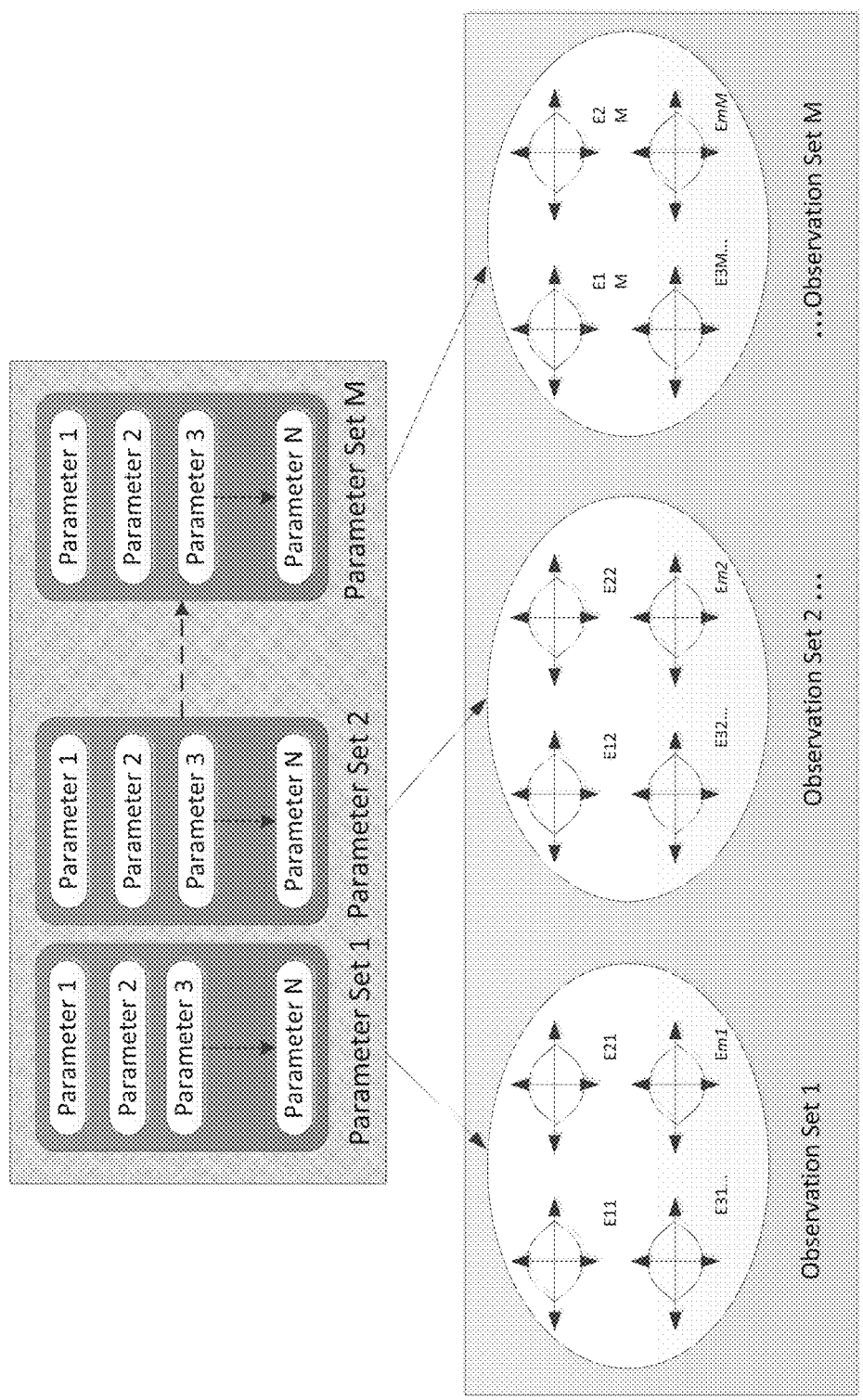
FIGS. 3-4 illustrate generic and specific examples of an electrical parameter set applied to an Interconnect for electrical margining, according to some embodiments.

Referring to FIG. 3, a diagram illustrating resultant eye observation sets based on electrical parameter sets is shown according to an embodiment. Each eye is shown with "E" followed by two digits, where the first digit refers the eye number in a given set and the second digit indicates the corresponding observation set. For example, as previously discussed, signal margining of high-speed interconnects may involve programming a trial set of electrical parameters into the interconnect RX/TX hardware (e.g., parameter sets 1 to M in FIG. 3), and then performing analysis of the resultant sample space of eye shapes at different sampling points that collectively constitute the eye schmoo. The set of eyes obtained (illustrated by observation sets 1 to M in FIG. 3) should meet certain requirements such as width/height, alignment to the eye center, etc. Also, even though each observation set is shown to include m number of eyes and there are also M sets, different number of eyes/sets may be used depending on the implementation.

Figure 4:
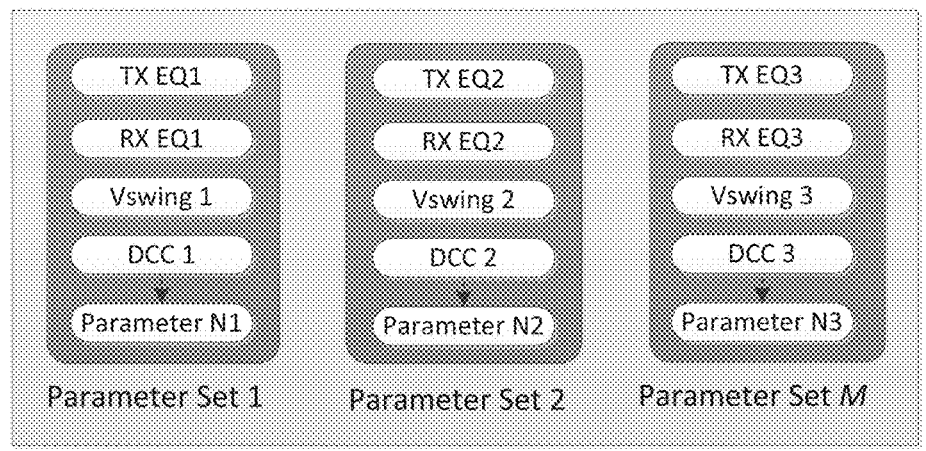

For example, as shown in the specific embodiment of FIG. 4, a selected electrical parameter set (e.g., corresponding parameter sets 1 to M of FIG. 3) may include a particular combination of TX/RX Equalization (EQ), CTLE (Continuous-Time Linear Equalization) coefficients, a Vswing (voltage bias) level, a selected Duty-Cycle Correction (DCC) coefficient, RComp (Resistor Compensation), a power supply parameter, etc. at one or both transmit and receive ends.

Figure 5:
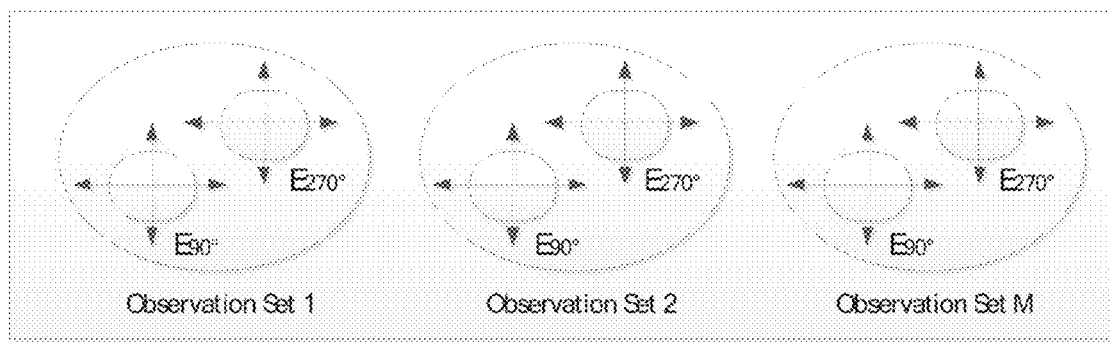
FIG. 5 illustrates a set of observation spaces produced by a two-sample circuit, according to an embodiment.

Moreover, eye measurement probes (which may be on-die) for HSDL (HSD Link) interconnects may be implemented as a Phase Interpolator (PI) and a Voltage Offset Compensation (VOC) pair. These probes support multiple independent sampling points depending on the number of phases the PI supports. Correspondingly, the PI/VOC pair may produce multiple eye shapes, each corresponding to one of the sampling points in the observation space. For example, a PI/VOC probe with sampling points at 90° and 270° of the input signal phase, respectively, may produce an observation set that has two eye shapes: E90° and E270°. FIG. 5 illustrates a set of observation spaces produced by a two-sample PI circuit, according to an embodiment.

Accordingly, the electrical margining logic or techniques discussed herein may comprehend a large parameter space composed of sets of electrical parameters that produce distinct sets of eye shapes in the observation space. As will be further discussed with reference to FIG. 10, the electrical margining logic (e.g., logic 120) may execute the following operations: (1) start the next sweep; (2) select and program a trial electrical parameter set from the large parametric space; (3) train the interconnect/channel; (4) store the resultant observation set of eye shapes in memory; (5) analyze this observation set for maximum robustness; (6) if maximum robustness is achieved (e.g., by comparison to a threshold value indicated by the most recent optimum value), then mark this parameter set as optimum (and if not, reject the parameter set); (7) continue operations 1-6 until the final optimum parameter set is obtained.

The objective of this logic is simple; namely, find the optimum electrical margining parameter set that produces the most robust set of eyes, and achieves maximum robustness of the interconnect during runtime. There are two factors that may determine the success of this algorithm: first, the ability to converge as quickly as possible onto the optimum parameter set; and second, establishing the criteria that define the optimality/robustness of the observation set (e.g., as represented by one or more threshold values derived from previous values as will be discussed further with reference to FIG. 10).

Figure 6:
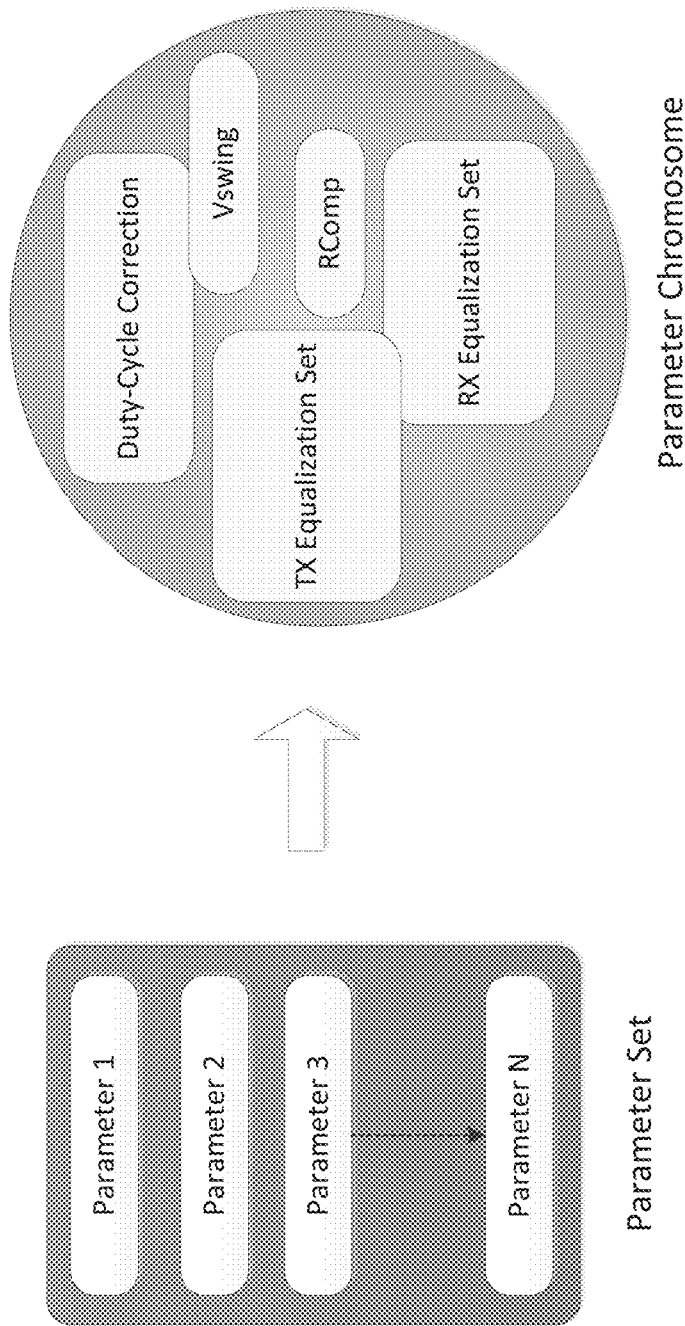
FIG. 6 is a chromosome representation diagram of electrical margining parameters, according to an embodiment.

FIG. 6 illustrates a chromosome representation of electrical margining parameters, according to an embodiment. Some embodiments pertain to a Genetic Algorithm (GA) based approach to achieve optimum electrical margining of a high-speed interconnect, e.g., in combination with an associated signal eye Optimization or Optimizer Engine (OE), such as logic 120 (or portions thereof) as discussed herein (including for example OE 702 discussed with reference to FIG. 7), that determines the ideal/optimum eye observation space. The GA algorithm is based on representation of the interconnect electrical parameters as genetic material that constitutes the interconnect "chromosome", as illustrated in FIG. 6 (where RComp refers to Resistor Compensation).

Figure 7:
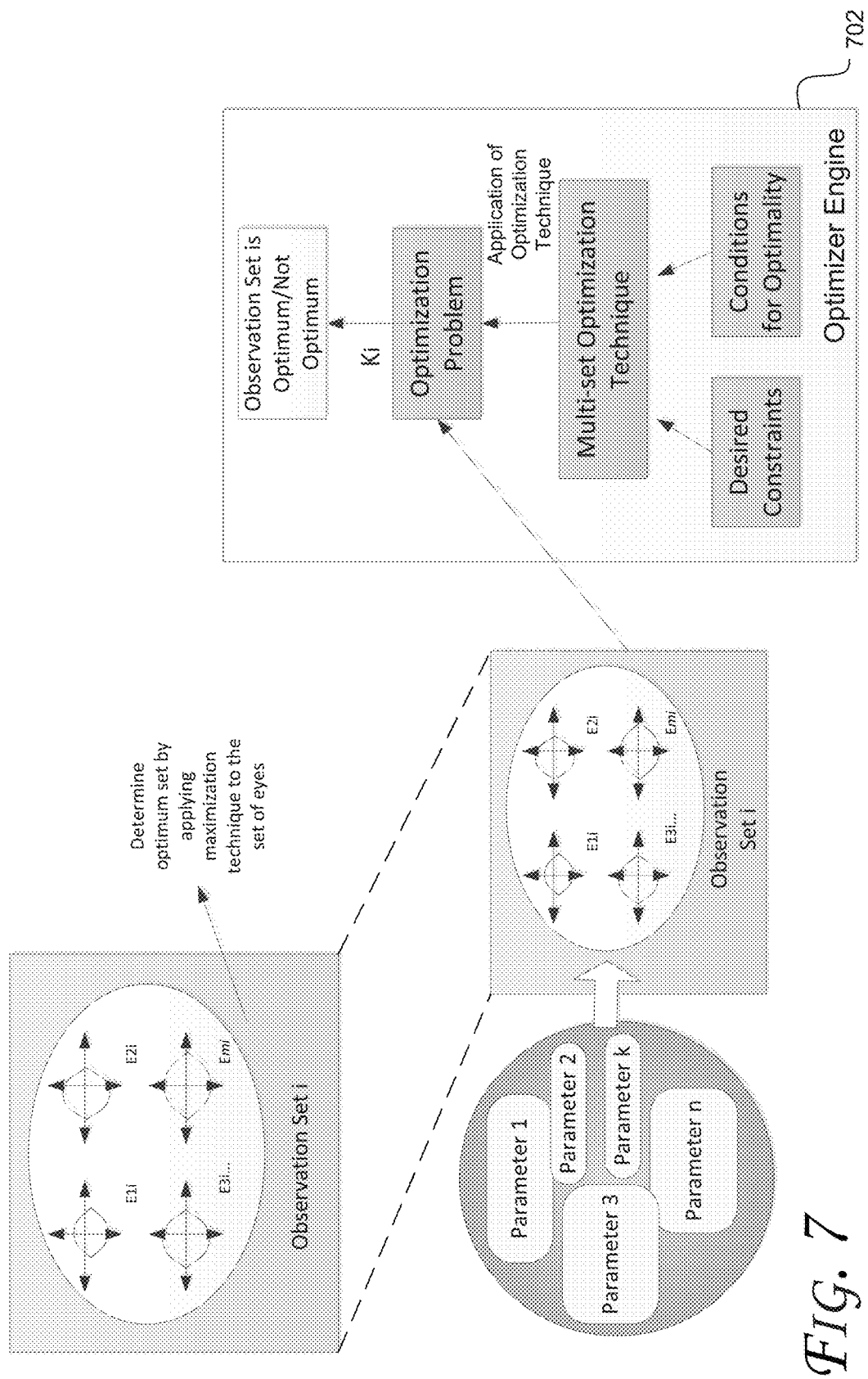
FIG. 7 illustrates an Optimizer Engine (OE) and the optimum eye determination problem, according to some embodiments.

FIG. 7 illustrates an Optimizer Engine (OE) and the optimum eye determination problem, according to some embodiments. As shown in FIG. 7, the OE 702 may perform various operations. Mathematically speaking, the GA modeling defines a set of chromosomes, S:

$$S=\{S1,S2,S3,\ldots,Sn\}$$

where Si is the ith chromosome that consists of a particular selection of the electrical margining parameter values (for example, TX/RX EQ settings, Vswing, Duty-Cycle Correction factor, etc.).

During a trial run, the margining logic (such as logic 120 or portions thereof) selects a particular chromosome, programs its electrical margining parameters into the interconnect RX/TX hardware, and then performs link training. Once the link is trained, the margining logic then probes the link using any probing technique (e.g., PI/VOC with pattern-based stress tests). This probing yields an observation set as depicted in FIG. 3. This observation set is denoted as E:

$$E=\{E1,E2,E3,\ldots,En\}$$

where, Ei is the ith set with eye samples (e1i, e2i, ..., eki).

For example, for a two-phase PI/VOC logic, there will be two eye samples per observation set:

$$Ei=\{e(90,i),e(270,i)\} \text{ for observation } i.$$

Each chromosome has a fitness function associated with it. The fitness function indicates how robust the eye observation set Ei is, when the chromosome Si is applied to the interconnect. The fitness function will be henceforth referred to as F. The Fitness function is based on the output of the Optimize Engine (OE) 702. The OE itself may use numerical optimization techniques. These techniques operate on the observation set E, treating E as a design vector whose Objective Function O(E) computes the global maximum of the sample set E for the i-th sample.

There are several mathematical optimization techniques to accomplish this task. These techniques represent the original problem, a constrained optimization problem, which is stated as follows:

Find $X=\{x1,x2\ldots Xn\}$ which minimizes f(X) subject to the constraints $$gj(X)\leq 0, j=1,2,\ldots,m$$

$$lj(X)=0, j=1,2,\ldots,p$$

where X is an n-dimensional vector called the design vector, f(X) is termed the objective function, and gj(X) and lj(X) are known as inequality and equality constraints, respectively. As discussed herein, X and Y are normalized values in accordance with some embodiments.

The problem of optimizing multiple eye shapes is a multivariable optimization problem with inequality constraints as described above. A PI/VOC probe produces a signal eye that may have four main values (PI Left, PI Right, VOC Up, and VOC Down) mapped to the domains described by FIG. 8.

Figure 8:
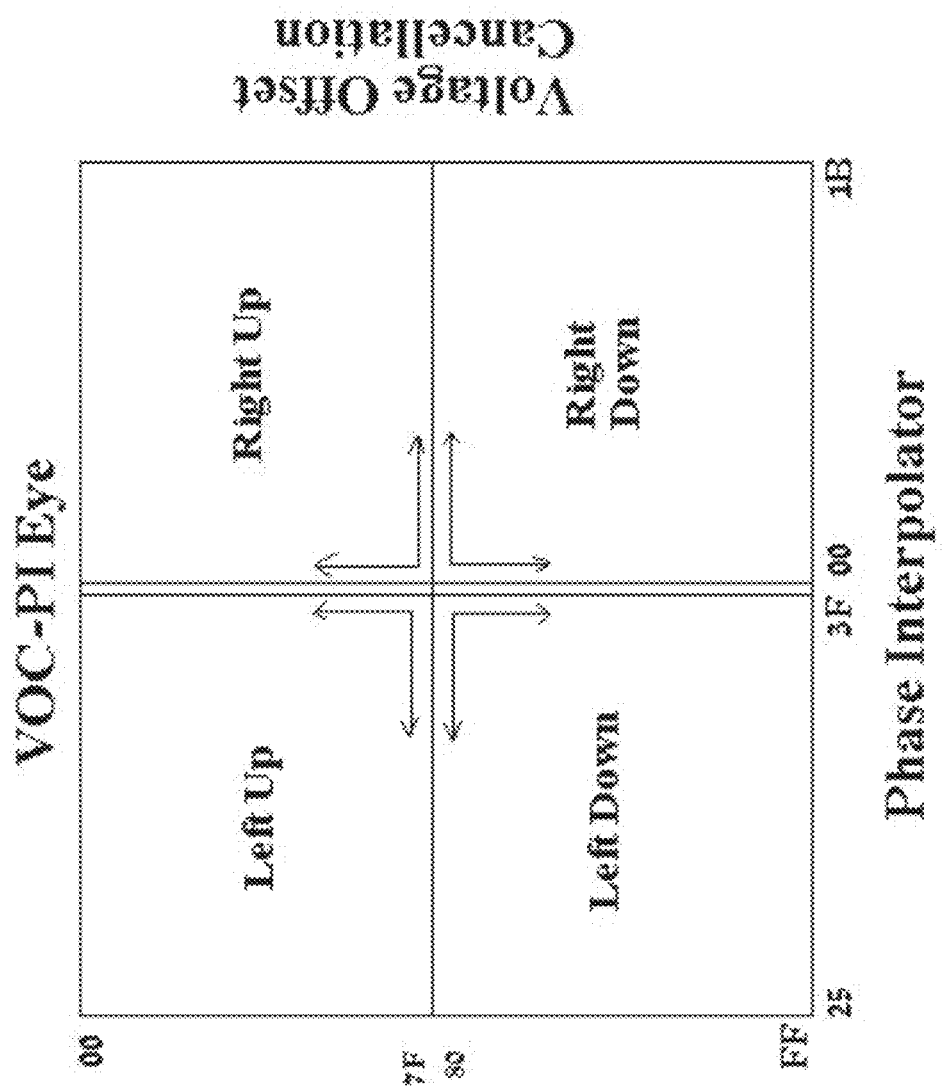
FIG. 8 shows an eye Shape illustrating the parameters to be optimized for optimum eye definition, according to an embodiment.

More particularly, FIG. 8 shows an eye Shape illustrating the parameters to be optimized for optimum eye definition, according to an embodiment. The optimization problem therefore reduces to finding the optimum set of eye dimension values as described above with reference to FIG. 8. Secondly, the eye shape should be such that there is maximum distance from the sampling point (optimum eye dimension) and moment about center of gravity with respect to the center of the eye. These conditions are input into the optimization technique implemented by the OE 702. An embodiment of the OE 702 may utilize the Kuhn Tucker optimization technique, which is an extension to the Lagrange multiplier technique for multi-parameter optimization problems, as will be further discussed below.

The application of the optimization technique yields a set of scalar values, K, that may be used to determine the optimality criterion for an observation space. With the OE embedded into the GA, the result of the Genetic Algorithm based search is a figure of merit that represents the best electrical margining chromosome $S_O$, which results in the most robust eye sample set $E_O$.

In various embodiments, the GA and OE logic (such as logic 120, OE 702, or combinations/portions thereof) may be implemented in hardware or firmware such as system BIOS (Basic Input/Output System) or a Manageability Engine (ME). The firmware-based implementation offers several advantages—notably flexibility, the ability to offload much of the involved mathematical/heuristic computational complexity to software, preservation of valuable silicon real estate by eliminating the need for a large memory in hardware to store the sample/parameter table, and at the same time, providing the flexibility to fine-tune the technique to adapt to the given platform ecosystem.

In accordance with some embodiments, the GA may include the following ingredients:

1. Fitness Function

Fitness function, F, is the application of the Optimality conditions, as described above.

2. Initial Chromosome Population

Prior to starting the trials for electrical margining, the GA needs an initial population of candidate chromosomes. This population may be obtained as either the default electrical margin parameters, or as a set of parameters from a "sweet spot", e.g., obtained through simulation performed earlier during the pre-silicon analysis phase of the manufacturing process. In due course of time, the initial chromosome population may be learnt across system boots and "remembered".

3. Selection of the Fittest Chromosome

Figure 9:
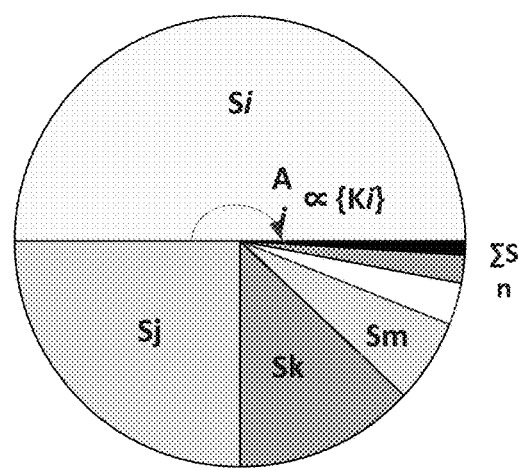
FIG. 9 illustrates a sample allocation scheme to determine the fittest chromosomes, according to an embodiment.

FIG. 9 illustrates a roulette wheel based allocation scheme to determine the fittest chromosomes, according to an embodiment. As shown, a roulette wheel may ensure that the fittest chromosomes are selected for the next sweep. Moreover, a given chromosome Si from the current population receives an angle Ai of the roulette wheel, where:

$$Ai=360°\times 1/Ki$$

Where Ki is a generic scalar returned by the OE after application of the Optimization technique on the observation set Ei.

$$Ki=F(Ei)$$

The roulette wheel is then rotated and observed at a pre-determined sampling point. The chromosome Si occupying the corresponding pie of the wheel at that time is then chosen to generate the next generation of chromosomes.

The probability that a given angle Ai will be selected is:

$$Pi=1/(1-Ai/360°)=1/(1-1/Ki)$$

4. Mutation

At randomly chosen trials during the search for the optimum chromosome, a given electrical settings (e.g., a given TX Equalization setting) of all chromosomes in the current population is replaced with a completely new electrical setting (a different TX Equalization setting). This mutation allows for faster convergence of the solution in accordance with the theory of operation of Genetic Algorithms.

5. Crossover

At randomly chosen trials during the search for the optimum chromosome, a selected electrical setting (e.g., the TX Equalization setting) of all chromosomes in the current population may be replaced with a completely new electrical setting (e.g., a different TX Equalization setting). This crossover, like mutation, allows for faster convergence of the solution in accordance with the Genetic Algorithm based theory of operation. However, the availability of a good initial population is not a necessary condition for the solution.

Figure 10:
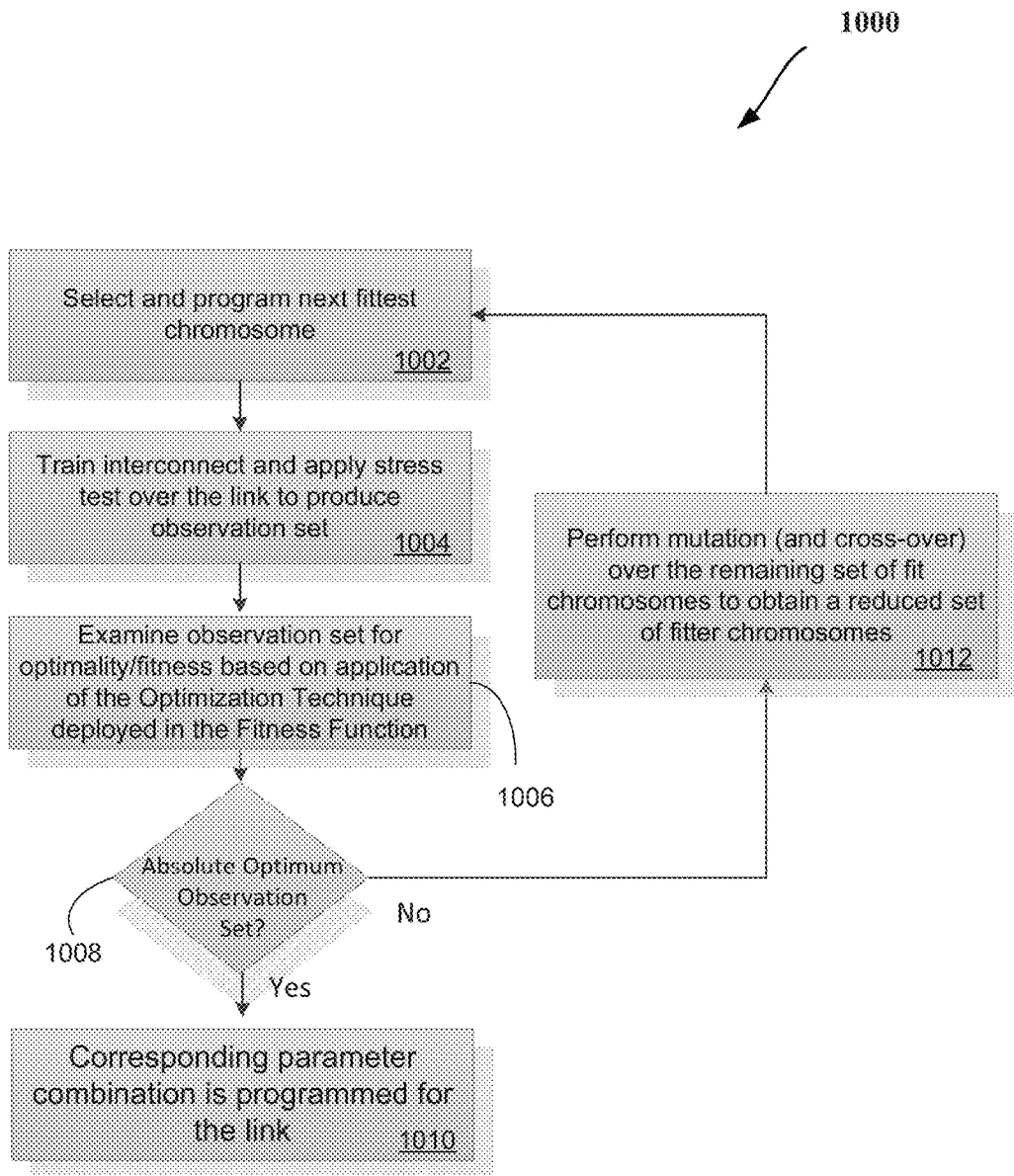
FIG. 10 illustrates a flow diagram of a method for a genetic algorithm, in accordance with an embodiment.

FIG. 10 illustrates a flow diagram of a method 1000 for a genetic algorithm, in accordance with an embodiment. Generally, the Genetic Algorithm exhibits elitism, where the fittest chromosome is always maintained at the end of each sweep. Namely, there is a global reference optimum (fittest) chromosome that is maintained. At the end of each sample j (e.g., after selecting and programming the next fittest chromosome at operation 1002, training the interconnect and applying stress test over the link to produce observations set at operation 1004, and examining observation set for optimality/fitness based on application of the optimization technique deployed via the fitness function at operation 1006, such as discussed with the reference to the previous figures), the current chromosome Sj is compared with the global reference chromosome Sopt (at operation 1008). If the current chromosome is fitter, then it replaces the global reference chromosome (at operation 1010). Otherwise, at operation 1012, mutation (and/or cross-over) operations may be performed over the remaining set of fit chromosomes to obtain a reduced set of fitter chromosomes.

For example:

if $Sj$>Sopt,

Sopt=$Sj$

This approach ensures that there is an elite set of chromosomes that remain at the end of the complete sweep. The Genetic Algorithm approach works in part because the electrical margining parameters all tend to converge to a "sweet spot" that produces the best margins.

In accordance with some embodiments, an electrical margining logic (e.g., logic 120) may execute the following operations: (1) start the next sweep at operation 1002; (2) select and program a trial electrical parameter set from the large parametric space at operation 1002; (3) train the interconnect/channel at operation 1004; (4) store the resultant observation set of eye shapes in memory after operation 1004; (5) analyze this observation set for maximum robustness at operation 1006; (6) if maximum robustness is achieved at operation 1008 (e.g., by comparison to a threshold value), then mark this parameter set as optimum at operation 1010 (and if not, reject the parameter set and continue with operation 1012); (7) continue operations 1-6 (e.g., operations 1002-1008 and 1012) until the final optimum parameter set is obtained (e.g., at operation 1010).

Figure 11:
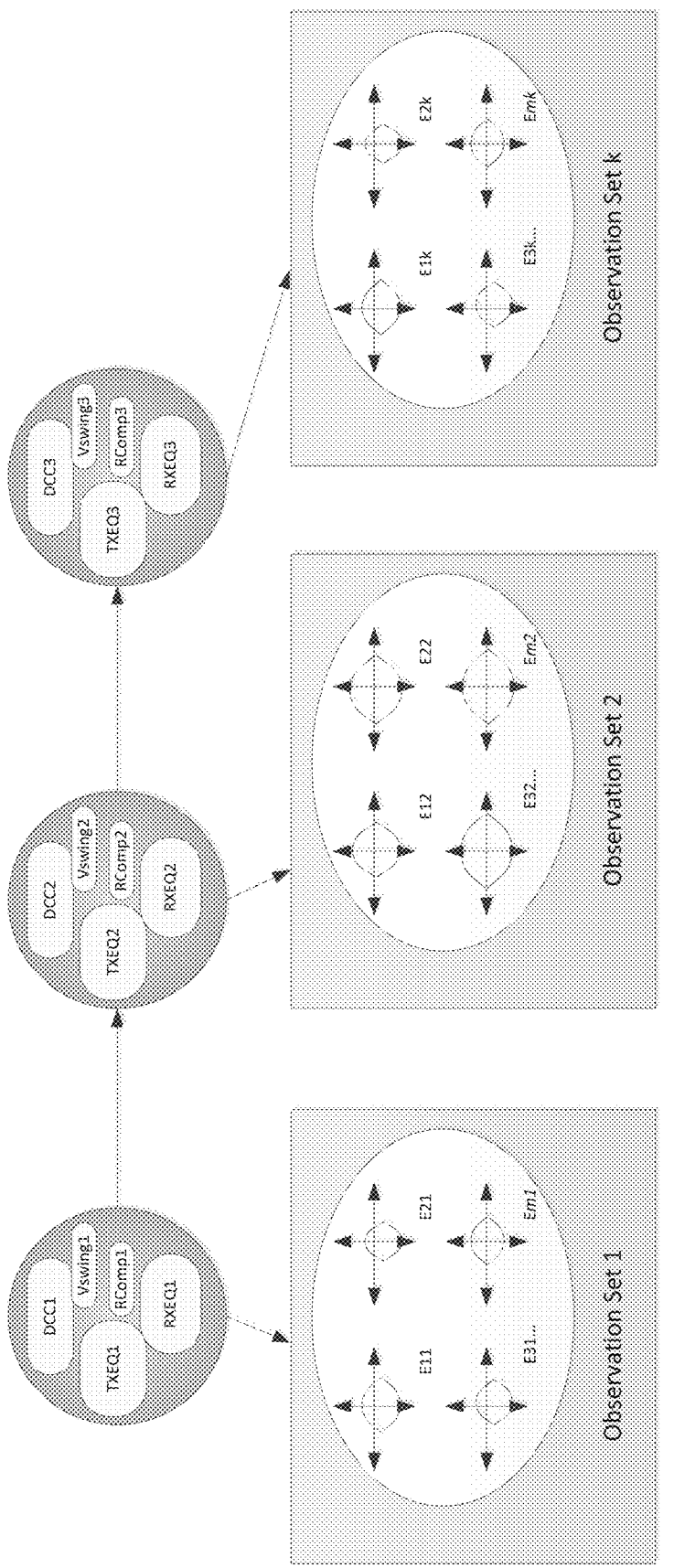
FIG. 11 illustrates application of a Genetic Algorithm based search for optimum set of electrical margining parameters, according to an embodiment.

FIG. 11 illustrates application of a Genetic Algorithm based search for optimum set of electrical margining parameters, according to an embodiment. Some embodiments facilitate the selection of the best eye for a given interconnect from among a range of other RX/TX equalization settings, and for a variety of on-die oscilloscope implementations that may include multiple observation points. An embodiment also provides for a variety of applications—from fast convergence on to the optimum electrical margining for the interconnect for very complex or large sets of eyes or characterization parameters to relatively simple cases where the eye characterization is based on simple thresholds, e.g., if the power supply is being modulated to obtain eyes that are within a certain threshold values.

As previously mentioned, an embodiment of the OE 702 may utilize the Kuhn Tucker optimization technique, which is an extension to the Lagrange multiplier technique for multi-parameter optimization problems. More particularly, let Eye 90 sample give out height-width information as X1 and Y1. And, let Eye 270 sample give out height-width information as X2 and Y2.

Favorable conditions for an Eye Sample are considered as: (1) large eye area; and (2) robustness around the eye center. Using condition (1), an Objective Function may be formed as follows:

$$F(X1,Y1)=X1*Y1$$

$$F(X2,Y2)=X2*Y2$$

$$F(X1,X2,Y1,Y2)=F(X1,Y1)+F(X2,Y2)$$

So the Objective Function is, $$F(X1,X2,Y1,Y2)=X1*Y1+X2*Y2$$

Using condition (2), the constraints may be formed as follows:

$$X1-Y1 \leq K1 \quad \text{C1:}$$

$$X2-Y2 \leq K2 \quad \text{C2:}$$

Put together, the Optimization Problem becomes:

$$\text{Maximize } [F(X1,X2,Y1,Y2)] = X1*Y1 + X2*Y2$$

$$X1-Y1 \leq K1 \quad \text{C1:}$$

$$X2-Y2 \leq K2 \quad \text{C2:}$$

where K1 and K2 are scalars which decide the robustness of the eye.

Moreover, the optimization problem may be identified as "Multivariable Optimization with Inequality Constraints". The type of optimization problem may be addressed with Kuhn-Tucker Conditions. In one embodiment, sampling may be used at two phases (90 & 270) but a generalized solution may also be provided. The analysis for a generalized case is done below.

The generalized problem statement now is:

$$\text{Maximize } [F(X1,X2\ldots,Xn,Y1,Y2\ldots,Yn)] = X1*Y1 + X2*Y2 + \ldots + Xn*Yn$$

$$X1-Y1 \leq K1 \quad \text{C1:}$$

$$X2-Y2 \leq K2 \quad \text{C2:}$$

$$Xn-Yn \leq Kn \quad \text{Cm:}$$

Where, $$g1 = X1-Y1-K1$$

$$g2 = X2-Y2-K2$$

$$gn = Xn-Yn-Kn$$

Accordingly, some embodiments involve representation of the electrical settings of an interconnect as chromosomes and application of Genetic Algorithm (GA) in combination with an associated quantitative optimization technique in order to search for and select the optimum electrical margining for a given high-speed differential link (HSD) interconnect. This offers the twin benefit of convergence to the right solution with minimal resource consumption (memory, processing, etc.). In an embodiment, a genetic algorithm based approach uses quantitative optimization techniques to solve the problem of selecting optimum electrical margining parameters for a high-speed interconnect. In one embodiment, a firmware or hardware resident logic (e.g., OE 702) uses the above techniques to determine optimum eye and, hence, optimum electrical margining for a high-speed interconnect.

Figure 12:
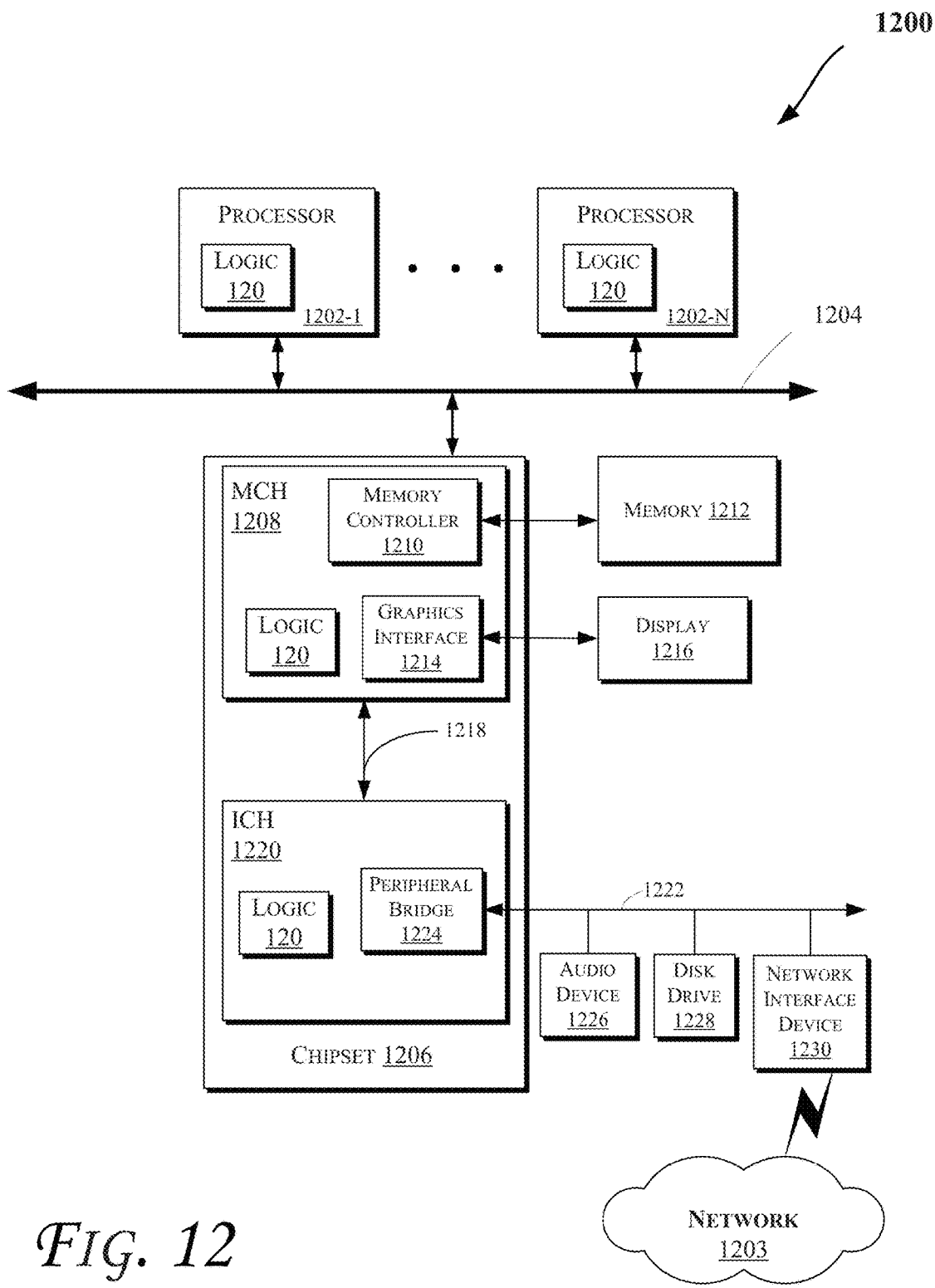

FIG. 12 illustrates a block diagram of a computing system 1200 in accordance with an embodiment of the invention. The computing system 1200 may include one or more central processing unit(s) (CPUs) 1202-1 through 1202-N or processors (collectively referred to herein as "processors 1202" or more generally "processor 1202") that communicate via an interconnection network (or bus) 1204. The processors 1202 may include a general purpose processor, a network processor (that processes data communicated over a computer network 1203), or other types of a processor (including a reduced instruction set computer (RISC) processor or a complex instruction set computer (CISC)). Moreover, the processors 1202 may have a single or multiple core design. The processors 1202 with a multiple core design may integrate different types of processor cores on the same integrated circuit (IC) die. Further, one or more agents or interconnects discussed herein may be on a package substrate (i.e., to implement a multi-chip module). Also, the processors 1202 with a multiple core design may be implemented as symmetrical or asymmetrical multiprocessors. Also, the operations discussed with reference to FIGS. 1-11 may be performed by one or more components of the system 1200. In some embodiments, the processors 1202 may be the same or similar to the processors 202-208 of FIG. 2. Furthermore, the processors 1202 (or other components of the system 1200) may include the logic 120 and/or OE 702.

A chipset 1206 may also communicate with the interconnection network 1204. The chipset 1206 may include logic 120. The chipset 1206 may include a memory controller hub (MCH) 1208. The MCH 1208 may include a memory controller 1210 that communicates with a memory 1212. The memory 1212 may store data, including sequences of instructions that are executed by the CPU 1202, or any other device included in the computing system 1200. For example, the memory 1212 may store data corresponding to an operation system (OS). In one embodiment of the invention, the memory 1212 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 1204, such as multiple CPUs and/or multiple system memories.

Additionally, one or more of the processors 1202 may have access to one or more caches (which may include private and/or shared caches in various embodiments) and associated cache controllers (not shown). The cache(s) may adhere to one or more cache coherent protocols. The cache(s) may store data (e.g., including instructions) that are utilized by one or more components of the system 1200. For example, the cache may locally cache data stored in a memory 1212 for faster access by the components of the processors 1202. In an embodiment, the cache (that may be shared) may include a mid-level cache and/or a last level cache (LLC). Also, each processor 1202 may include a level 1 (L1) cache. Various components of the processors 1202 may communicate with the cache directly, through a bus or interconnection network, and/or a memory controller or hub. Also, each of the processors 1202 (or each core present in the processors 1202) may include the logic 120 in some embodiments.

The MCH 1208 may also include a graphics interface 1214 that communicates with a display device 1216, e.g., via a graphics accelerator. In one embodiment of the invention, the graphics interface 1214 may communicate with the graphics accelerator via an accelerated graphics port (AGP). In an embodiment of the invention, the display 1216 (such as a flat panel display) may communicate with the graphics interface 1214 through, for example, a signal converter that translates a digital representation of an image stored in a storage device such as video memory or system memory into display signals that are interpreted and displayed by the display 1216. The display signals produced by the display device may pass through various control devices before being interpreted by and subsequently displayed on the display 1216.

A hub interface 1218 may allow the MCH 1208 and an input/output control hub (ICH) 1220 to communicate. The ICH 1220 may provide an interface to I/O devices that communicate with the computing system 1200. The ICH 1220 may communicate with a bus 1222 through a peripheral bridge (or controller) 1224, such as a peripheral component interconnect (PCI) bridge, a universal serial bus (USB) controller, or other types of peripheral bridges or controllers. The bridge 1224 may provide a data path between the CPU 1202 and peripheral devices. Other types of topologies may be utilized. Also, multiple buses may communicate with the ICH 1220, e.g., through multiple bridges or controllers. Moreover, other peripherals in communication with the ICH 1220 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 1222 may communicate with an audio device 1226, one or more disk drive(s) 1228, and a network interface device 1230 (which is in communication with the computer network 1203). Other devices may communicate via the bus 1222. Also, various components (such as the network interface device 1230) may communicate with the MCH 1208 in some embodiments of the invention. In addition, the processor 1202 and one or more other components of the system 1200 (such MCH 1208, memory controller 1210, etc.) may be combined to form a single chip (such as a System On Chip (SOC)).

Furthermore, the computing system 1200 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 1228), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 13:
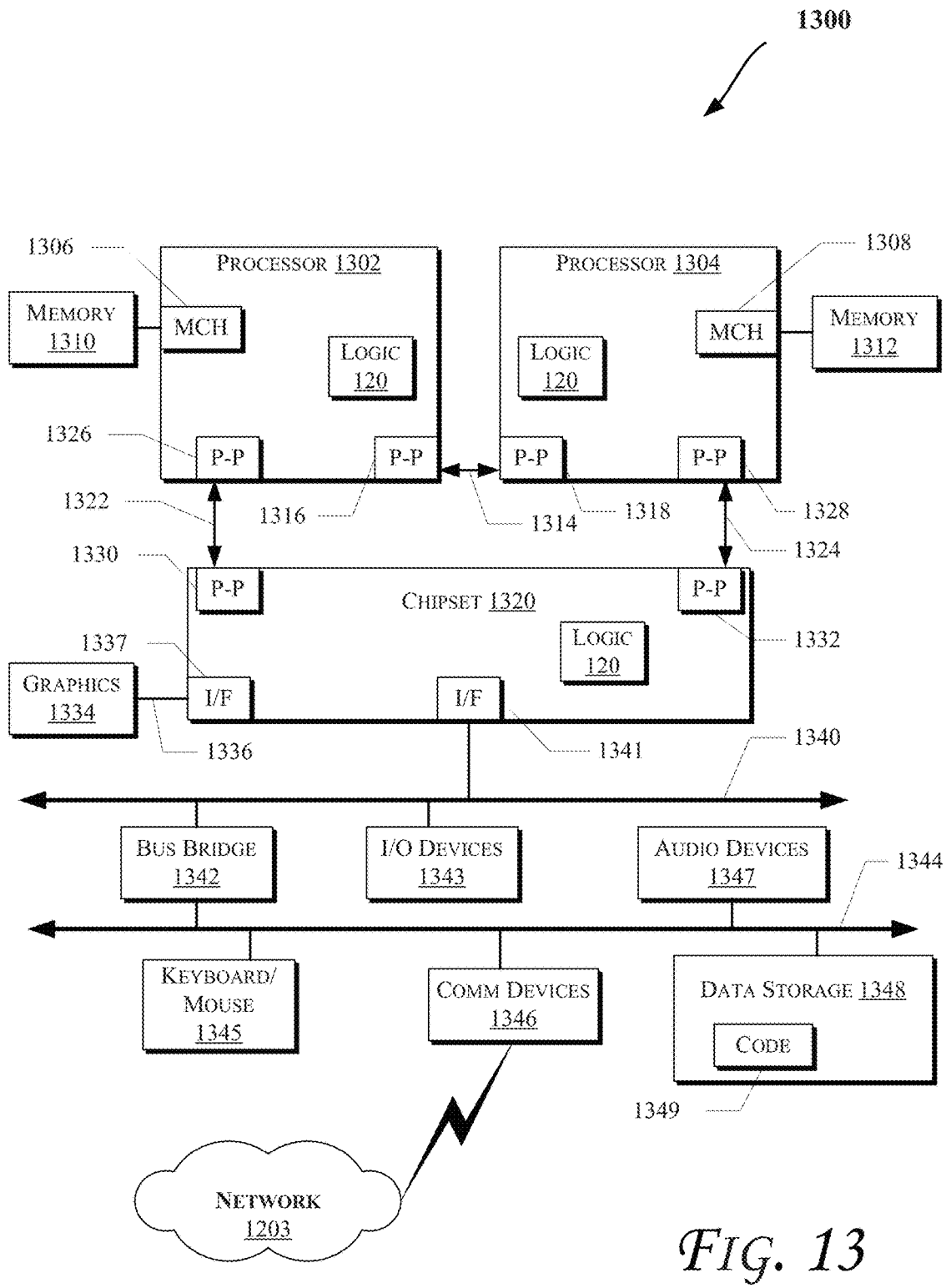

FIG. 13 illustrates a computing system 1300 that is arranged in a point-to-point (PtP) configuration, according to an embodiment of the invention. In particular, FIG. 13 shows a system where processors, memory, and input/output devices are interconnected by a number of point-to-point interfaces. The operations discussed with reference to FIGS. 1-12 may be performed by one or more components of the system 1300.

As illustrated in FIG. 13, the system 1300 may include several processors, of which only two, processors 1302 and 1304 are shown for clarity. The processors 1302 and 1304 may each include a local memory controller hub (MCH) 1306 and 1308 to enable communication with memories 1310 and 1312. The memories 1310 and/or 1312 may store various data such as those discussed with reference to the memory 1212 of FIG. 12. As shown in FIG. 13, the processors 1302 and 1304 may also include the cache(s) discussed with reference to FIG. 12.

In an embodiment, the processors 1302 and 1304 may be one of the processors 1202 discussed with reference to FIG. 12. The processors 1302 and 1304 may exchange data via a point-to-point (PtP) interface 1314 using PtP interface circuits 1316 and 1318, respectively. Also, the processors 1302 and 1304 may each exchange data with a chipset 1320 via individual PtP interfaces 1322 and 1324 using point-to-point interface circuits 1326, 1328, 1330, and 1332. The chipset 1320 may further exchange data with a high-performance graphics circuit 1334 via a high-performance graphics interface 1336, e.g., using a PtP interface circuit 1337.

At least one embodiment of the invention may be provided within the processors 1302 and 1304 or chipset 1320. For example, the logic 120 may be provided within the processors 1302 and 1304 (or within each core of the processors 1302 and/or 1304). Other embodiments of the invention, however, may exist in other circuits, logic units, or devices within the system 1300 of FIG. 13. Furthermore, other embodiments of the invention may be distributed throughout several circuits, logic units, or devices illustrated in FIG. 13.

The chipset 1320 may communicate with a bus 1340 using a PtP interface circuit 1341. The bus 1340 may have one or more devices that communicate with it, such as a bus bridge 1342 and I/O devices 1343. Via a bus 1344, the bus bridge 1342 may communicate with other devices such as a keyboard/mouse 1345, communication devices 1346 (such as modems, network interface devices, or other communication devices that may communicate with the computer network 1203), audio I/O device, and/or a data storage device 1348. The data storage device 1348 may store code 1349 that may be executed by the processors 1302 and/or 1304.

In various embodiments of the invention, the operations discussed herein, e.g., with reference to FIGS. 1-13, may be implemented as hardware (e.g., circuitry), software, firmware, microcode, or combinations thereof, which may be provided as a computer program product, e.g., including a (e.g., non-transitory) machine-readable or (e.g., non-transitory) computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-13. Additionally, such computer-readable media may be downloaded as a computer program product, wherein the program may be transferred from a remote computer (e.g., a server) to a requesting computer (e.g., a client) by way of data signals transmitted via a carrier wave or other propagation medium via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:
1. A method comprising:
 generating one or more parameter values, corresponding to an electrical operating margin of an interconnect, based on a plurality of eye observation sets to be detected in response to operation of the interconnect in accordance with a plurality of parameter sets; and operating the interconnect at the one or more parameter values based on a determination that the one or more parameter values cause the interconnect to operate at a first level relative to an operation of the interconnect at a second level with one or more less optimum parameter values than the one or more parameter values corresponding to the first level, wherein each of the plurality of observation sets comprises a plurality of eye shapes, wherein the plurality of eye shapes are generated based on repetitive sampling of a digital data signal from a receiver while a data rate of the digital data signal is used to trigger a horizontal sweep, wherein the one or more parameter values or each of the plurality of parameter sets are represented as chromosomes for a genetic algorithm, wherein a fittest one of the chromosomes is selected for a next sweep.

2. The method of claim 1, further comprising configuring the interconnect to operate at an electrical margin based on an analysis of multiple eye sampling points detected by a plurality of probes.

3. The method of claim 1, further comprising analyzing the plurality of eye observation sets for robustness, wherein the robustness is to be determined based on a fitness function.

4. A system comprising:
an interconnect to couple a first agent to a second agent;
memory to store one or more parameter values;
logic to generate the one or more parameter values, corresponding to an electrical operating margin of an interconnect, based on a plurality of eye observation sets to be detected in response to operation of the interconnect in accordance with a plurality of parameter sets,
wherein the interconnect is to operate at the one or more parameter values based on a determination that the one or more parameter values cause the interconnect to operate at a first level relative to an operation of the interconnect at a second level with one or more less optimum parameter values than the one or more parameter values corresponding to the first level, wherein each of the plurality of observation sets is to comprise a plurality of eye shapes, wherein the plurality of eye shapes are to be generated based on repetitive sampling of a digital data signal from a receiver while a data rate of the digital data signal is to be used to trigger a horizontal sweep, wherein the one or more parameter values or each of the plurality of parameter sets are to be represented as chromosomes for a genetic algorithm, wherein a fittest one of the chromosomes is to be selected for a next sweep.

5. The system of claim 4, wherein the interconnect is to be configured to operate at an electrical margin based on an analysis of multiple eye sampling points detected by a plurality of probes using quantitative optimization techniques.

6. The system of claim 4, wherein one or more of the first agent, the second agent, or the interconnect are on the same integrated circuit die or on a same package substrate.

7. The system of claim 4, wherein the repetitive sampling of the digital data signal from the receiver is to be applied to a vertical input of an oscilloscope.

8. The system of claim 4, wherein the interconnect is to be configured to operate at an electrical margin based on an analysis of multiple eye sampling points detected by a plurality of probes.

9. The system of claim 8, wherein the analysis is to comprise analyzing the plurality of eye observation sets for robustness, wherein the robustness is to be determined based on a fitness function.

10. The system of claim 4, wherein the one or more parameter values correspond to one of the plurality of parameter sets.

11. The system of claim 4, wherein a plurality of probes is to comprise a phase interpolator probe and a voltage offset compensation probe.

12. The system of claim 4, wherein each of the plurality of observation sets is to comprise one or more requirements of: a width value, a height value, and alignment to an eye center.

13. The system of claim 4, wherein the each of the plurality of parameter sets or the one or more parameter values are to comprise one or more of the following parameters at one or both transmit or receive ends: an equalization parameter, a resistor compensation parameter, a duty-cycle correction coefficient, and a power supply parameter.

14. The system of claim 4, wherein the interconnect is to comprise a high-speed differential link interconnect.

15. The system of claim 4, wherein the interconnect is to comprise one or more point-to-point interconnects.

16. The system of claim 4, wherein the interconnect is to couple a first agent and a second agent, and wherein the first agent or the second agent is to comprise a processor having one or more processor cores.

17. The system of claim 4, wherein one or more of the first agent, the second agent, or the link are on the same integrated circuit die.

18. The system of claim 4, wherein a power supply, coupled to the apparatus, is to be modulated to obtain eyes that are within a certain threshold.

19. One or more non-transitory computer-readable medium comprising one or more instructions that when executed on at least one processor configure the at least one processor to perform one or more operations to:
generate one or more parameter values, corresponding to an electrical operating margin of an interconnect, based on a plurality of eye observation sets to be detected in response to operation of the interconnect in accordance with a plurality of parameter sets; and
operate the interconnect at the one or more parameter values based on a determination that the one or more parameter values cause the interconnect to operate at a first level relative to an operation of the interconnect at a second level with one or more less optimum parameter values than the one or more parameter values corresponding to the first level, wherein each of the plurality of observation sets comprises a plurality of eye shapes, wherein the plurality of eye shapes are generated based on repetitive sampling of a digital data signal from a receiver while a data rate of the digital data signal is used to trigger a horizontal sweep, wherein the one or more parameter values or each of the plurality of parameter sets are represented as chromosomes for a genetic algorithm, wherein a fittest one of the chromosomes is selected for a next sweep.

20. The computer-readable medium of claim 19, further comprising one or more instructions that when executed on the at least one processor configure the at least one processor to perform one or more operations to cause configuration of the interconnect to operate at an electrical margin based on an analysis of multiple eye sampling points detected by a plurality of probes.

21. The computer-readable medium of claim 19, further comprising one or more instructions that when executed on the at least one processor configure the at least one processor to perform one or more operations to cause analysis of the plurality of eye observation sets for robustness, wherein the robustness is to be determined based on a fitness function.

\* \* \* \* \*